United States Patent [19]
Zulian

[11] Patent Number: 4,951,301
[45] Date of Patent: Aug. 21, 1990

[54] TTL TECHNOLOGY DIGITAL TIMING UNIT

[75] Inventor: Ferruccio Zulian, Cornaredo, Italy

[73] Assignee: BULL HN Information Systems Italia S.p.A., Milan, Italy

[21] Appl. No.: 56,915

[22] Filed: Jun. 1, 1987

[30] Foreign Application Priority Data

Jun. 10, 1986 [IT] Italy .............................. 20731 A/86

[51] Int. Cl.$^5$ .................... H03K 23/54; H03K 5/153; H03K 5/13

[52] U.S. Cl. ........................ 377/54; 377/43; 328/63; 328/155

[58] Field of Search ................ 328/63, 55, 72, 73, 328/133, 134, 155; 377/43, 110, 54; 307/269, 511, 525–527

[56] References Cited

U.S. PATENT DOCUMENTS

| | | | |
|---|---|---|---|
| 4,105,979 | 8/1978 | Kage | 328/134 |
| 4,390,960 | 6/1983 | Yamashita et al. | 377/54 |
| 4,504,960 | 3/1985 | Yamada | 328/155 |
| 4,564,953 | 1/1986 | Werking | 307/269 |
| 4,641,044 | 2/1987 | Shiraishi | 307/269 |
| 4,656,649 | 4/1987 | Takahashi | 377/48 |

OTHER PUBLICATIONS

Sundararajan et al., "Multiple-Wait-State Generator Handles Slow Peripherals", Electronic Design, Aug. 18, 1983, pp. 228–229.
Verkützer Wait-Zyklus Beschleunigt 68000–Systeme, Pal Poth, Elektronik, No. 3, Oct. 2, 1984, pp. 59–60.

Primary Examiner—John S. Heyman
Assistant Examiner—Tai V. Duong
Attorney, Agent, or Firm—Gerald J. Cechony; John S. Solakian; Lewis P. Elbinger

[57] ABSTRACT

Timing unit for generating a timing signal for synchronous microprocessors in which an oscillator generates a base frequency equal to four times the timing frequency for the microprocessor. A frequency divider divides the base frequency by four, and a shift register clocked by the base frequency and receiving a timing signal from the frequency divider, generates a mask signal. The mask signal is selectively applied to a control input of the frequency divider in response to one or more control signals, to inhibit the switching of the frequency divider. This thereby introduces in the phases of the timing frequency, wait states equal to ¼ (or multiple thereof) of the timing frequency, thereby matching the microprocessor speed to the memory read/write cycle time.

4 Claims, 5 Drawing Sheets

TTL TECHNOLOGY DIGITAL TIMING UNIT

BACKGROUND OF THE INVENTION

1. Field of the Invention

The present invention relates to a timing unit implemented with TTL technology for use with data processing systems utilizing fast microprocessors.

2. Description of the Prior Art

It is known that particularly fast integrated microprocessors have been recently made available to the market. They operate on the basis of high frequency timing cycles.

The Motorola 68020 microprocessor, for example, can operate with a clock rate of 16.66 MHz and units operating at 20 MHz will soon be marketed.

These microprocessors used in conjunction with a few external components and peripheral units, memories, input/output data units and peripheral controllers may constitute complete data processing systems.

In such systems in order to exploit the full potential and speed of said microprocessors it is necessary to make use of fast memories with a read/write cycle time comparable to the execution time required by the microprocessors to carry out a memory data read/write operation.

Typically to execute a memory read operation the 68020 microprocessor requires 3 clock cycles; that is, 180 nsec. at the 16.66 MHz clock rate.

These cycles consist of 6 successive phases, S0, S1, S2, S3, S4, S5 in which the timing signal is alternatively at logic level "1" and "0".

As the memory address is made available by the microprocessor within the first half clock cycle (phase S0) and the read out data must be available in the first half of the third clock cycle (within phase S4), it is necessary that the memory read cycle, from the time when the memory is addressed to the time when the read out data is available, does not exceed 90 nsec.

In order to be able to use memories that do not operate at such a speed, the 68020 microprocessor (and others similar to it) is provided with an interval arrangement that allows wait cycles to be inserted.

The availability of the read data within a certain period of time must be "preannounced" to the microprocessor through the activation of a DTACK signal at logic level "0" by an external memory management unit (MMU).

If this signal is activated during phase S2 the microprocessor loads the data read from memory into an interface register at the beginning of phase S5 and the read operation is completed in three subsequent clock cycles.

If signal DTACK is not asserted during phase S2 the microprocessor enters a wait state for a clock cycle.

If the DTACK signal is received during the wait cycle the microprocessor resumes operation and completes the read operations in three successive phases S3, S4, S5; that is, the read operation is carried out in 4 clock cycles.

If the DTACK signal is not asserted even during the wait cycle the microprocessor remains in the wait state during further timing cycles.

It is obvious that under those conditions a considerable decrease in performance takes place.

Therefore the use of fast memories and architectures allowing information to be transferred between microprocessor and memory without appreciable delay times is essential.

In spite of these contrivances, it may, however, happen that the memory read cycle exceeds the desirable time for just a few nanoseconds, which causes the insertion of wait cycles whose duration is equal to 60 nsec. or more and a performance decrease that is disproportionate to the actual requirements.

The best of the knowledge available so far on the matter, can be found in the article "Verkurzter WAIT-Zyklus beschleunight 68000 Systeme" published in the magazine "Electronik" No. 3, Oct. 2, 1984, on pages 59–60. This article describes a circuit used for selectively generating wait states with a duration of only $\frac{1}{2}$ and not $\frac{1}{4}$ of the clock cycle. Furthermore a frequency divider unit, activated by a clock generator has a feedback loop which comprises a frequency divider flip flop and a NAND gate in series.

The frequency operation is therefore limited by the sum of the following propagation delay times:

(a) delay time of flip flop with respect to the clock,
(b) delay time of signal in the NAND gate,
(c) set-up time of input signal to flip flop.

Even greater is the restriction introduced by the control network for the insertion of wait states, which comprises a loop which, besides the flip flop and the previously mentioned NAND gate includes a further NAND gate.

Another drawback of the circuit described in the above-mentioned article is that it uses an (AS) signal generated by the microprocessor to generate a wait state to stop the timing unit; whereas the restart of the timing unit is determined by the (DTACK) signal generated by the memory.

This is an extremely risky approach because in case of no answer from the memory a "dead lock" occurs; that is, a system unrecoverable halt condition arises.

In addition, the described circuit can lengthen the cycle time by $\frac{1}{4}$ only in phase S2; whereas it would be useful to have timing units that allow cycle times to be lengthened also in the successive phases such as, for instance, phase S3 or s4.

In fact the activation of the DTACK signal by the Memory Management Unit within a pre-fixed time has the following two implications.

First the MMU must be really able to answer within the pre-fixed time consistently with the read instruction received.

Second, once the DTACK signal has been generated, the read data must be really available with a delay not greater than a given value; that is, the duration of phases S3 and This limitation should be usefully removed by allowing the memories (which can be of various types) to output valid data with different delays by lengthening phases S3 or S4.

OBJECTS OF THE INVENTION

Accordingly it is an object of the invention to provide a data processing system with improved microprocessor, memory timing balance.

SUMMARY OF THE INVENTION

In order to overcome this drawback the microprocessor can be operated at a clock rate slightly lower than the maximum allowable clock rate. In other words it is possible to adapt the clock rate to the memory requirements.

For instance, with the hypotheses previously made, if the memory read cycle requires 105 ns instead of 90 ns, which would allow the microprocessor to operate with a 60 ns cycle time, a clock rate p calculated from the following formula, can be adopted:

$$(p+p/2) \geqq 105 \text{ say } 1.5\ p \geqq 105\ p \geqq 70\ ns$$

This results in a systematic performance decrease greater than 15%.

The timing unit made with the TTL technology, overcomes, at least partially, such drawbacks.

This timing unit allows the clock cycle to be selectively varied, through a command, by inserting in a timing signal, wait states whose duration is equal to $\frac{1}{4}$, $\frac{1}{2}$ or $\frac{3}{4}$ of the normal clock cycle.

In this way operations are delayed only when needed and for the required time amount.

This is achieved through the use of a high frequency clock generator and of JK flip flops, made with TTL technology, serially connected so as to act as a frequency divider.

This frequency divider is controlled by very simple control logic which, during operation, is synchronized by the high frequency clock generator that selectively inhibits the switching of the frequency divider for one or more clock generator cycles.

A fundamental characteristic of the timing unit is that each element of the unit, be it the frequency divider or the control unit, is synchronized with the clock generator and it is made up of a single logic element (flip flop) so that the frequency operation is only limited by the sum of the maximum propagation delay of an element output signal with respect to the clock and of the maximum set-up time of the input signal with respect to the clock of the next element. This is an important consideration because the solutions to this problem put forward with the aim of generating delays in the timing signals equal to a fraction of the clock cycle have proven operative only with much lower clock rates, or else they require the use of circuit made with fast technologies, such as the ECL technologies that provide output signals that are compatible neither with the interface characteristics of the most widely used microprocessors on the market nor with the TTL technologies.

Thus from a logic viewpoint, it is possible to envisage a timing unit that, in case of memory read operations, generates a partial wait state during phase S2 so as to allow the DTACK signal to be received during a lengthened phase S2. Then, in accordance with the received signals, it selectively decides whether or not to lengthen phase S4, in order to take into account the specific duration of the read cycle of the concerned memory.

These advantages are achieved by the timing unit object of the present invention which not only allows wait states equal to $\frac{1}{4}$ of the cycle time to be inserted in phases S2 and S4, but also it permits various durations of the wait states equal to $\frac{1}{4}$, $\frac{1}{2}$, $\frac{3}{4}$ of the clock time to be chosen according to the specific requirements.

BRIEF DESCRIPTION OF THE DRAWINGS

These advantages and the features of the present invention, will become apparent from the following description of a preferred embodiment and from possible variations thereof when read in conjunction with the attached drawings where.

DESCRIPTION OF PREFERRED EMBODIMENTS

Figure 1:
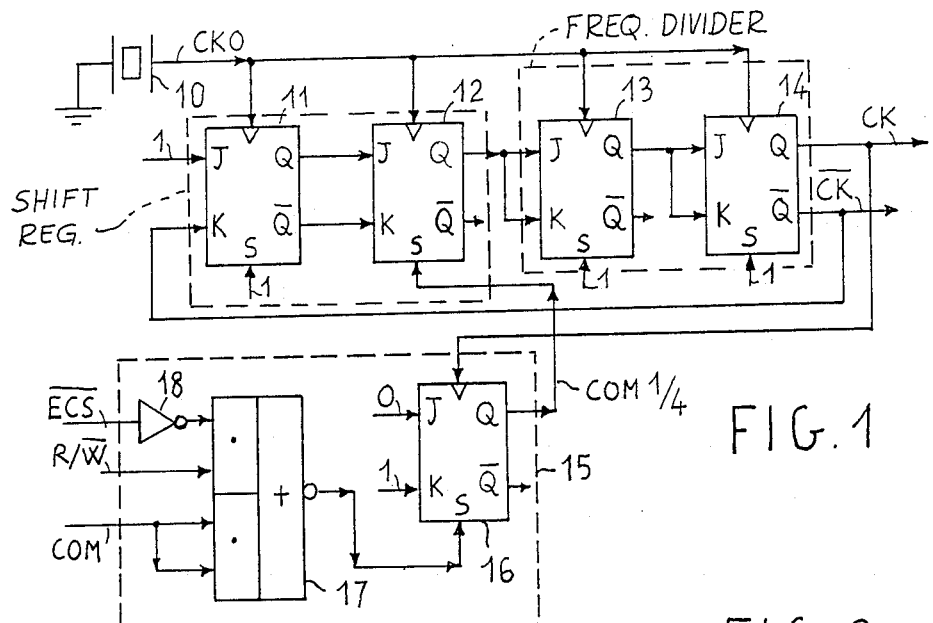
FIG. 1 shows a preferred embodiment of a timing unit organized according to the invention for the generation of wait states equal to $\frac{1}{4}$ of the timing cycle.

FIG. 1 shows a preferred embodiment of a timing unit that allows the duration of the various phases to be selectively lengthened by $\frac{1}{4}$ of the clock cycle.

The unit comprises a crystal oscillator 10 for the generation of CK0 signal having a frequency equal to 4 times that of the timing signal; that is 66.6 MHz, 4 flip flops 11, 12, 13 and 14 of the JK type and a control logic 15 for the generation of a delay command signal COM $\frac{1}{4}$. Flip flops 11, 12, 13, 14 are typically FAIRCHILD 74F113 logic circuits.

They are made with the fast TTL technology and provide, within a wide range of operating conditions for the following performances:

minimum "set up" time of signals at inputs J and K with respect to the clock signal equal to 5 nsec.

maximum delay time from the clock to the outputs equal to 7 nsec.

maximum delay time from the set input to the equal to 7.5 nsec.

recovery time from the set input to the clock input equal to 5 nsec.

maximum switching frequency greater than 100 MHz.

The state diagram of the JK flip flops is shown below:

| J | K | S | Q |
|---|---|---|---|
| 0 | 0 | 1 | $Q_n$ |
| 0 | 1 | 1 | 0 |
| 1 | 0 | 1 | 1 |
| 1 | 1 | 1 | $\overline{Q_n}$ |
| X | X | 0 | 1 |

These flip flops are set by the falling edge of the clock signal connected to the timing input.

A logic level 0 at the S set input sets the flip flop in an asynchronous mode.

All the flip flops shown in FIG. 1 have the timing input connected to crystal oscillator 10 by the CK0 timing signal.

Outputs Q and $\overline{Q}$ of the flip flop 11 are connected to inputs JK respectively of flip flop 12.

The Q output of flip flop 12 is connected to input J and K of flip flop 13.

The Q output of flip flop 13 is connected to input J and K of flip flop 14.

The $\overline{Q}$ output of flip flop 14 signal $\overline{CK}$ is connected to input K of flip flop 11.

The J input of flip flop 11 and the S set input of flip flop 11, 13, 14 are permanently held at logic level 1.

The S set input of flip flop 12 is connected to the output of the control logic 15 and it receives a signal COM ¼ at logic level 0 when unit 15 is inactive.

Therefore flip flop 12 is normally in a set state.

Thus under normal conditions flip flop 13 toggles at each falling edge of the CK0 signal generating in output a CK1 square wave signal with a frequency equal to ½ of the CK0 frequency.

In the same way flip flop 14 toggles at each falling edge of the CK1 signal generating a CK square wave signal with a frequency equal to ¼ of the CK0 frequency.

Thus if the period of the clock generator is 15 nsec. the period of the CK signal is 60 nsec.

If the period of the clock generator 10 is 12.5 nsec. the period of the CK signal is 50 nsec.

When flip flop 14 is reset, a $\overline{CK}$ signal at logic level 1 is applied to the K input to flip flop 11 which changes from set to reset state at the first received falling edge of the CK0 signal to switch back again to the set state at the following falling edge of the CK0 signal.

If unit 15 is disabled; that is, if the set input of flip flop 12 is at logic level 0, the state of flip flop 11 does not affect the state of flip flop 12.

If unit 15 is enabled and if the set input of flip flop at a logic level 1 flip flop 12 is reset at the 12 is falling edge of the CK0 signal. Flip flop 11 is again set at the next falling edge of the CK0 signal.

In other words flip flop 12 follows the state of flip flop 11 with a delay equal to the CK0 clock period.

It follows that with the same falling edge of CK0 flip flop 13 does not switch because both its inputs are at logic level 0.

In other words the switching of flip flop 13 is disabled for a clock period through the control of the signal present at inputs J and K.

Figure 2:
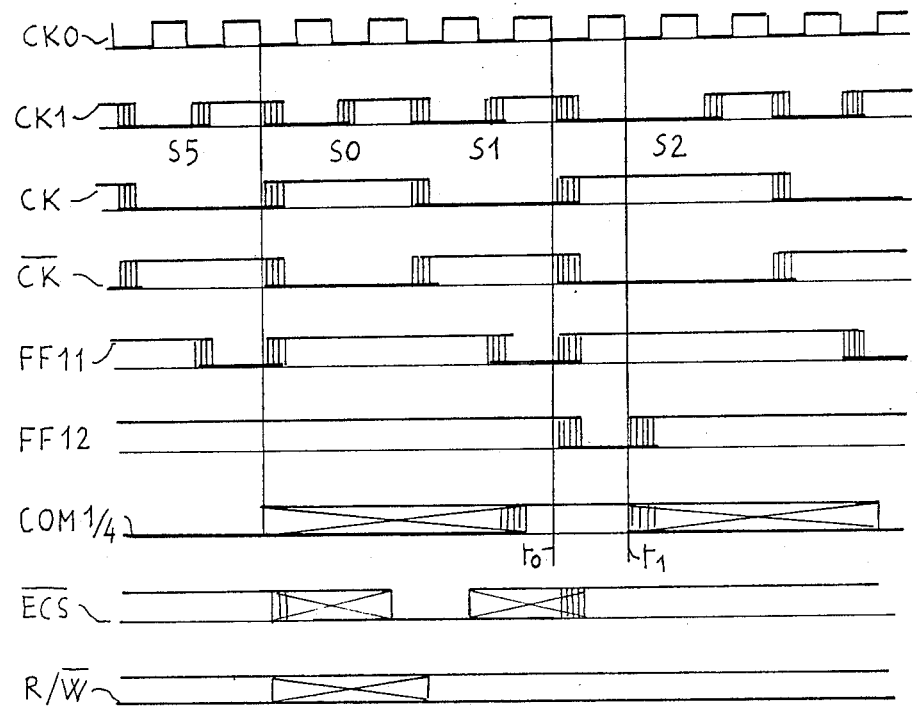
FIG. 2 shows in timing diagram the operation of the unit depicted in FIG. 1.

FIG. 2 shows in timing diagram the logic level of the CK0 signal, the logic level of the COM ¼ command signal, the logic level CK1 signal at the Q output of flip flop 13, the logic level CK and $\overline{CK}$ signals at output Q and $\overline{Q}$ respectively of flip flop 14 and the state (logic level at the Q output) of flip flops 11 and 12.

It is clear that the state of the various serially connected flip flops is defined by univocal relations and that the switching of flip flop 13 is disabled when in a reset state.

It follows that flip flop 14 is held in set state during 3 CK0 clock periods; that is, the CK timing signal (like the $\overline{CK}$ signal) is lengthened by ¼ of its period.

In FIG. 2 the dashed zones of signals CK1, CK, FF11 and FF12 show the propagation time of the components.

As for the COM ¼ command signal, the dashed zone, instead, indicates the time interval during which the command may change its logic level without the time unit's behaviour being affected.

In other words the COM ¼ command signal must have a stable level (that is, either "1" or "0") depending on whether or not a delay of ¼ of the period should be inserted in the periodic time interval defined by instants "t0" and "t1" of FIG. 2.

Therefore, there is a long time lag equal to the duration of the CK period, minus the signal propagation time that elapses from the set input to the output (which is equal to 7.5 nsec.) of flip flop 12 to preset the COM ¼ command signal at logic level 1 and reset it at logic level 0, before and after t1.

This allows great flexibility in the implementation of the command logic 15 and in the choice of the signals that define whether or not the COM ¼ command signal should be generated depending on the data processing system to be timed.

FIG. 1 shows a preferred embodiment of the command logic 15 which is particularly suitable for timing those systems that are based on the 68020 microprocessor.

As already mentioned the 68020 microprocessor carries out external read/write operations during 3 (or more) clock cycles that define six phases from S0 to S5.

The external operations are characterized by the microprocessor, as opposed to internal operations, by the generation, on the part of the microprocessor, of an $\overline{ECS}$ signal which goes to logic level 0 at least 10 nsec. before the beginning of phase S1 and rises to logic level 1 during phase S1.

The external operation is characterized as a read operation, by a R/W signal at logic level 1 which must be present at least from the beginning of phase S1.

Signals R/W and $\overline{ECS}$ are signals suitable to control command logic 15.

This logic is constituted by a JK type flip flop 16, such as the 74F113 type described earlier, a 74F64 AND-OR-INVERTER GATE 17 and by a 74F04 inverter 18 of the type marketed by FAIRCHILD.

These last two components have a maximum delay time of 7.5 and 6 nsec. respectively.

The timing input of flip flop 16 is connected to the Q output of flip flop 14; that is, it receives the CK timing signal.

The S set signal of flip flop 16 is connected to the output of logic gate 17, and inputs J and K are held at logic level 0 and 1 respectively.

The Q output of flip flop 16 signal COM ¼ is connected to the set input of flip flop 12.

The $\overline{ECS}$ signal is applied to the input of inverter 18, whose output is connected to a first input of an AND section of gate 17 and the R/W signal is applied to a second input of the same section.

It is easy to verify that flip flop 16, when its set input is at logic level 1, is alternately set and reset by the falling edge of the CK0 signal that is, at the end of phases S0, S2, S4.

However if the $\overline{ECS}$ signal is generated at logic level 0 and if the external operation is defined as a read operation by the R/W signal at logic level 1, flip flop 16 is set and its Q output rises to 1.

This occurs with a maximum delay of 7.5+7.5=15 nec. with respect to the end of phase S0; that is, within the time limits in which the COM ¼ signal must be preset.

The output of flip flop 16 is held at logic level 1 until it is reset by the falling edge of the CK signal; that is, with a maximum delay of 7 nsec. with respect to the end of phase S2, therefore within the allowed time lag.

Therefore the generation of signals $\overline{ECS}$ and R/W at logic level 0 by the microprocessor allows phase S2 to be selectively lengthened by ¼ of the clock period for the external read operations.

The lengthening of phase S2 can be essential to allow the microprocessor to receive a DTACK signal (not shown), which is generated by a Memory Management Unit (not shown) during the lengthened phase S2, without the insertion of an entire wait cycle.

However the function of unit 15 is not limited to the selective lengthening of phase S2.

By applying a suitable timed selective COM command signal to the inputs of a second section of gate 17 it is possible to lengthen any one, or more than one, of the phase S0, S2, S4.

For example if the Memory Management Unit, besides the DTACK signal also generates the COM signal at logic level 1, with the same timing of the signal DTACK; that is within the end of phase S2, and if it holds this signal for a suitable time interval (that is, until the end of phase S2, at least) at the end of phase S2 flip flop 16 is set or held set, which causes phase S4 to be lengthened. This allows a relatively slow memory to read out data within the lengthened phase S4.

FIG. 1 shows only a preferred embodiment of the invention, it is however clear that many changes can be made to it.

For example it is possible to connect the $\overline{Q}$ output of flip flop 14 to the J input of flip flop 11 rather than to the K input.

In this case the K input will be held at logic level 1 and outputs Q and $\overline{Q}$ of flip flop 11 will have to be connected to inputs K and J of flip flop 12 respectively.

In other words, in this case the two flip flops 11 and 12 act as if they were a two stage shift register determining a logic level inversion between the two stages.

Likewise it is possible to replace the JK type flip flop triggered by a falling edge of a clock signal by a JK type flip flop triggered by a rising edge, like the 74F109 type flip flops.

In any case the approach followed in the embodiment is to have a clock signal source with a frequency equal to 4 times the frequency of the timing unit that is to be selectively lengthened, a frequency divider (flip flops 13, 14) and a shift register (flip flops 11, 12) connected in such a way as to all be timed by the clock signal, the shift register receiving from the frequency divider a periodical signal limited to the duration of a clock period and suitably delayed so as to make up a mask signal which is synchronized with the clock signal and which can be used to selectively disable, on external command with much longer synchronization margin, the switching of the frequency divider.

By using the above approach it is possible to implement a timing unit that allows wait states equal of $\frac{1}{4}$, $\frac{1}{2}$ and $\frac{3}{4}$ of the timing period to be selectively generated.

Figure 3:
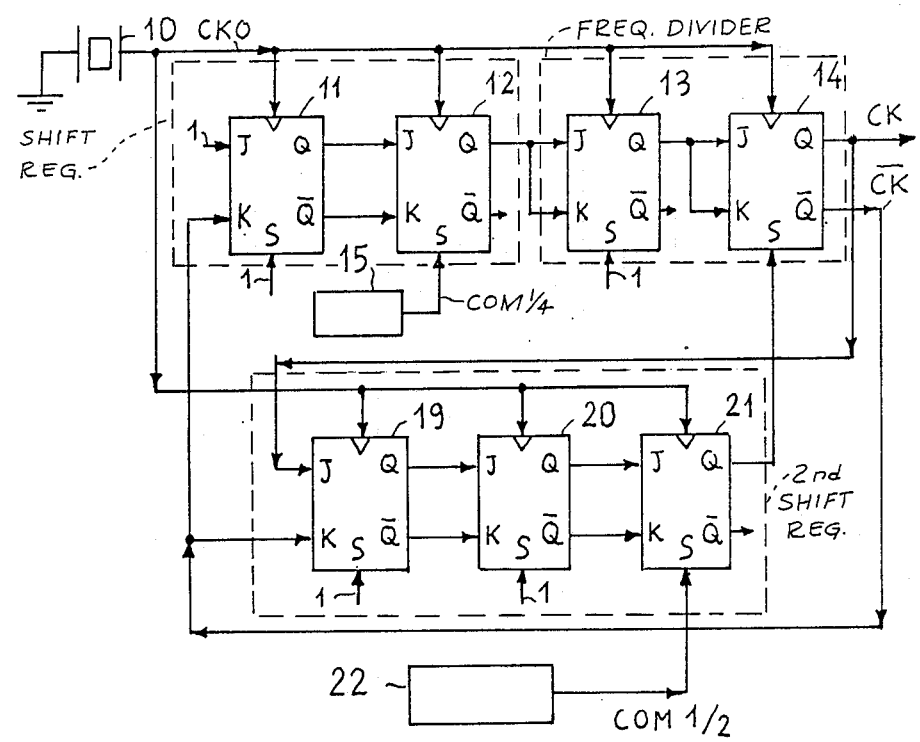
FIG. 3 shows a preferred embodiment of the timing unit organized according to the invention for the generation of wait states equal to $\frac{1}{4}$, $\frac{1}{2}$, $\frac{3}{4}$ of the timing cycle.

This unit is shown in FIG. 3 and it comprises, besides the components already mentioned with reference to FIG. 1, 3 JK flip flops 19, 20, 21 (of the 74F113 type) that are cascade connected so as to make up a shift register, and a command logic unit 22.

The operation of the crystal oscillator 10, flip flops 11, 12, 13, 14 and the command logic unit 15 were previously discussed with reference to FIG. 1. The J input of flip flop 19 is connected to the Q output of flip flop 14 to receive the CK timing signal.

The K input of flip flop 19 is connected to the $\overline{Q}$ output of flip flop 14 signal $\overline{CK}$.

Outputs Q and $\overline{Q}$ of flip flop 19 are connected to inputs and K of flip flop 20 respectively.

Outputs Q and $\overline{Q}$ of flip flop 20 are connected to inputs J and K of flip flop 21 respectively.

The Q output of flip flop 21 is connected to the set input of flip flop 14.

The output of command logic unit 22 signal COM $\frac{1}{2}$ is connected to the set input of flip flop 21 which is normally held at logic level 0. The set inputs of flips flops 19 and 20 are permanently held at logic level 1.

The clock inputs of flip flops 19, 20, 21 are connected to the output signal CK0 of the crystal quartz generator 10.

Figure 4:
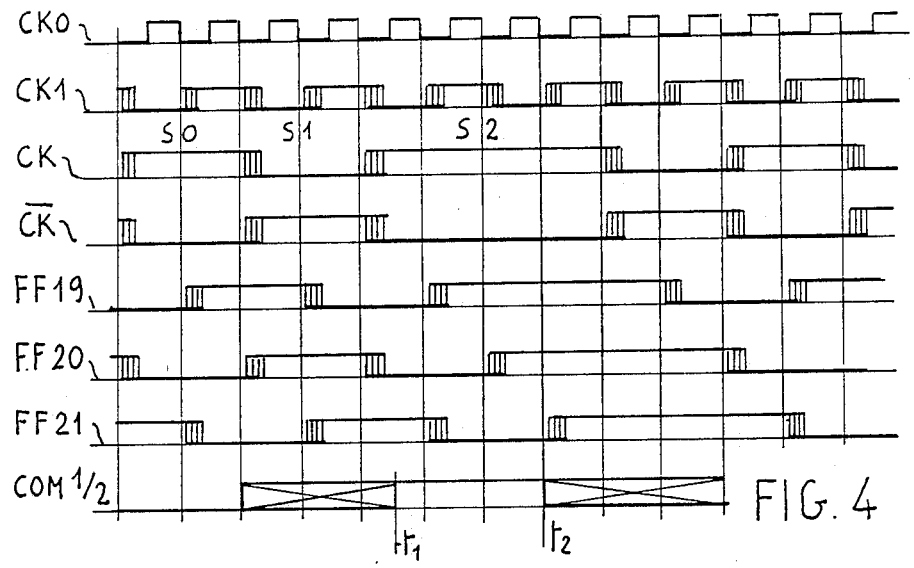
FIGS. 4 and 5 show in timing diagram the operation of the unit shown in FIG. 3.
Figure 5:
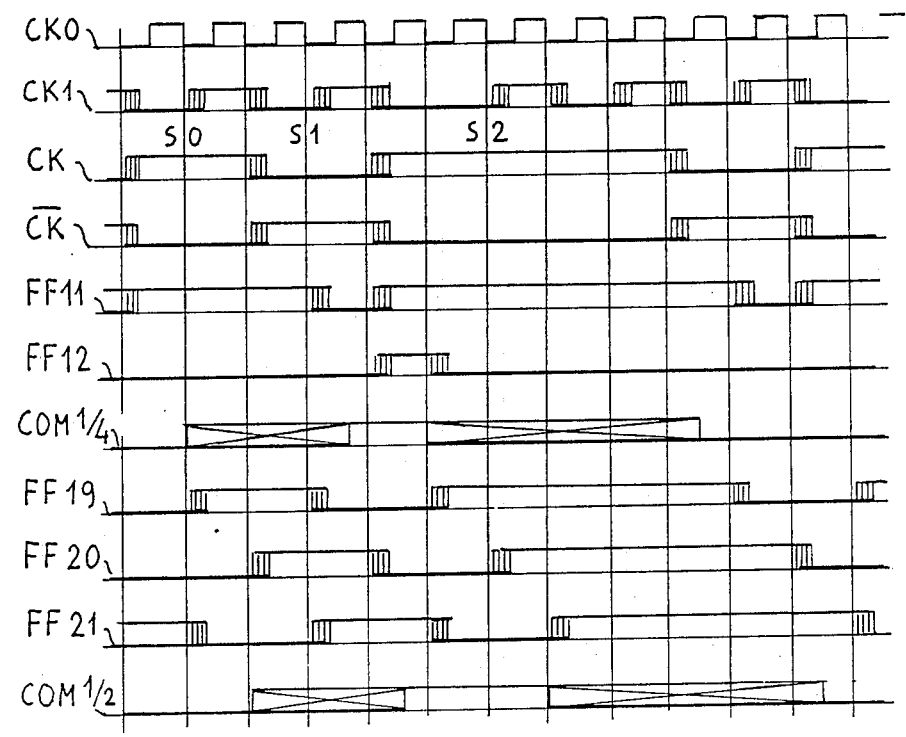

The operation of the timing unit shown in FIG. 3 can be easily understood by referring to the timing diagrams represented in FIG. 4 and FIG. 5. They describe the timing unit's behaviour in case where a COM $\frac{1}{4}$ signal output from unit 15 is held at logic level 0. The CK0 signal shows the timing output from generator 10.

The CK1 signal shows the state (or logic level present at the Q output) of flip flop 13 and signal CK and $\overline{CK}$ show the logic level present at outputs Q and $\overline{Q}$ respectively of flip flop 14.

FF 19 and FF20 and FF 21 show the state of flip flops 19, 20 and 21.

With reference to FIG. 4, the state of flip flop 12 is not shown because it is permanently held by signal COM $\frac{1}{4}$ at logic level 0.

Therefore flip flop 13 toggles with a 30 nsec. period and as long as the set input of flip flop 14 is at logic level 1 also flip flop 14 toggles with a 60 nsec. period. Flip flop 19 and flip flop 20 follow the state of flip flop 14 with a delay of one and two CK0 clock periods respectively.

Flip flop 21 follows the state of flip flop 14 with a delay of 3 CK0 clock periods but only if the COM $\frac{1}{2}$ signal applied to the set input is at logic level 1 for a suitable time interval.

FIG. 4 shows that the COM $\frac{1}{2}$ must be forced to logic level 1 during the time interval from $t_1$ to $t_2$; that is, no later than $30-(5+7)=18$ nsec. with respect to the rising edge of CK in the case where the CK period is 60 nsec. and no later than $25-(5+7)=13$ nsec. in the case where the CK period is 50 nsec.

Obviously the COM $\frac{1}{2}$ signal can be generated much earlier, however, not before the CK signal falls to logic level 0. The allowable range for the generation of the COM $\frac{1}{2}$ signal is therefore greater than the half-period of the CK signal.

In order for the COM $\frac{1}{2}$ signal to act correctly, it must go to logic level 0 after flip flop 21 is set (instant $t_2$) and before the subsequent rise of the CK signal.

The allowable range for the resetting of the COM $\frac{1}{2}$ signal is therefore greater than a half-period of the CK signal.

If these conditions are met, flip flop 21 is reset for the duration of two CK0 signal periods and the switching of flip flop 14 is disabled.

This causes flip flop 14 to remain in the set state for 4 periods of the CK0 signal and the corresponding phase to be lengthened by $\frac{1}{2}$ of the clock period.

The lengthening thus obtained is independent of the $\frac{1}{4}$ lengthening determined by the COM $\frac{1}{4}$ signal and therefore they can be added in the same phase as shown in the timing diagram of FIG. 5. Referring to FIG. 5 which shows not only the logic level of signals CK0, CK1, CK, $\overline{CK}$, COM $\frac{1}{2}$ and flip flops 19, 20, 21 but also the logic level of both the COM $\frac{1}{4}$ signal and flip flop 12.

Therefore by the joint effect of signals COM $\frac{1}{4}$ and COM $\frac{1}{2}$ it is possible to obtain lengthenings or wait states equal to $\frac{3}{4}$ of the clock period and, by selectively generating signals COM $\frac{1}{4}$ and COM $\frac{1}{2}$ it is possible to obtain wait states whose lengths can be $\frac{1}{4}$, $\frac{1}{2}$ or $\frac{3}{4}$ of the clock period.

These wait states can be inserted in either one of phases S2 and s4 or in both of them.

Figure 6:
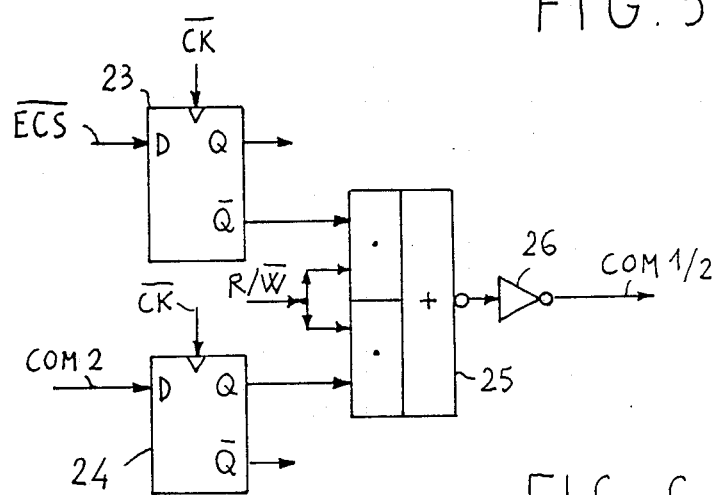
FIG. 6 shows a preferred embodiment of a control logic for the unit shown in FIG. 3.

FIG. 6 shows a preferred embodiment of the command logic 22. This logic is constituted by two D-type flip flops 23, 24, typically the FAIRCHILD 74F74 flip flop, a logic AND-OR-INVERTER gate 25 and an inverter 26.

The clock input of the two flip flops receives the $\overline{CK}$ signal from the $\overline{Q}$ output of flip flop 14. The $\overline{ECS}$ signal coming from the microprocessor is applied to the D input of flip flop 23. A COM 2 signal which is generated, for instance, by a Memory Management Unit (not shown) is applied to the D input of flip flop 24.

The $\overline{Q}$ output of flip flop 23 and the Q output of flip flop 24 are each connected to an input of a different AND section of gate 25 and another input of the two AND sections is connected to the $R/\overline{W}$ signal.

The output of gate 25 is connected to the input of inverter 26 whose output signal COM $\frac{1}{2}$ is connected to the S input of flip flop 21.

Flip flops 23 and 24 are enabled by the rising edge of the timing signal.

Thus, at the beginning of phase S1 with the rising edge of the $\overline{CK}$ signal, flip flop 23 is reset if signal $\overline{ECS}$ is at logic level 0 and if signal $R/\overline{W}$ is at logic level 1, then the output signal COM $\frac{1}{2}$ of inverter 26 rises to logic level 1.

This occurs with a maximum delay of approximately 20 nsec. from the rising edge of the $\overline{CK}$ signal.

In the same way if a Memory Management Unit generates a signal COM 2 pulse that rises before the end of phase S2 (for instance synchronously with the DTACK signal) and is held at logic level 1 at least until the end of phase S2, then flip flop 24 is set and if signal $R/\overline{W}$ is at logic level 1, then the output signal COM $\frac{1}{2}$ of inverter 26 goes to logic level 1.

In the first case phase S2 can be lengthened by $\frac{1}{2}$ cycle. In the second case it is possible to lengthen phase S4 by $\frac{1}{2}$ cycle.

It is clear that the logic of FIGS. 3 and 6 represent only some preferred embodiments of the invention and that changes can be made to lengthen phases by other amounts.

For example, the input signals to the pairs of flip flops chosen among flip flops 19, 20, 21 can be mutually exchanged without affecting the timing units behaviour.

In the same way, by using flip flops of either the 74F112 or the 74F109 type, which besides the reset input are also provided with the set input, it is possible to change various connections without affecting the unit's functionality and therefore according to the concept, explained earlier, of making use of a base frequency generator, a base frequency divider and of a shift register controlled by an external signal, to generate, on reception of the timing signal coming from the divider output, a mask pulse, synchronized with the base frequency and suitably delayed. This mask pulse is selectively applied to the input of the frequency divider to stop it from switching, only if an external command signal is present which has a very long time lag to be preset or removed.

The circuital embodiments described above require that the COM $\frac{1}{4}$ command signal which determines the insertion of a wait state equal to $\frac{1}{4}$ be present well in advance of the phase to be lengthened.

So, if the phase to be lengthened is phase S2, the command signal must be present at least 12 nsec. before the beginning of phase S2. Furthermore if the COM $\frac{1}{4}$ signal is obtained by decoding certain conditions (such as $\overline{ECS}=0$, $R/\overline{W}=1$) the worst case delay time of command logic must be kept into account.

Figure 7:
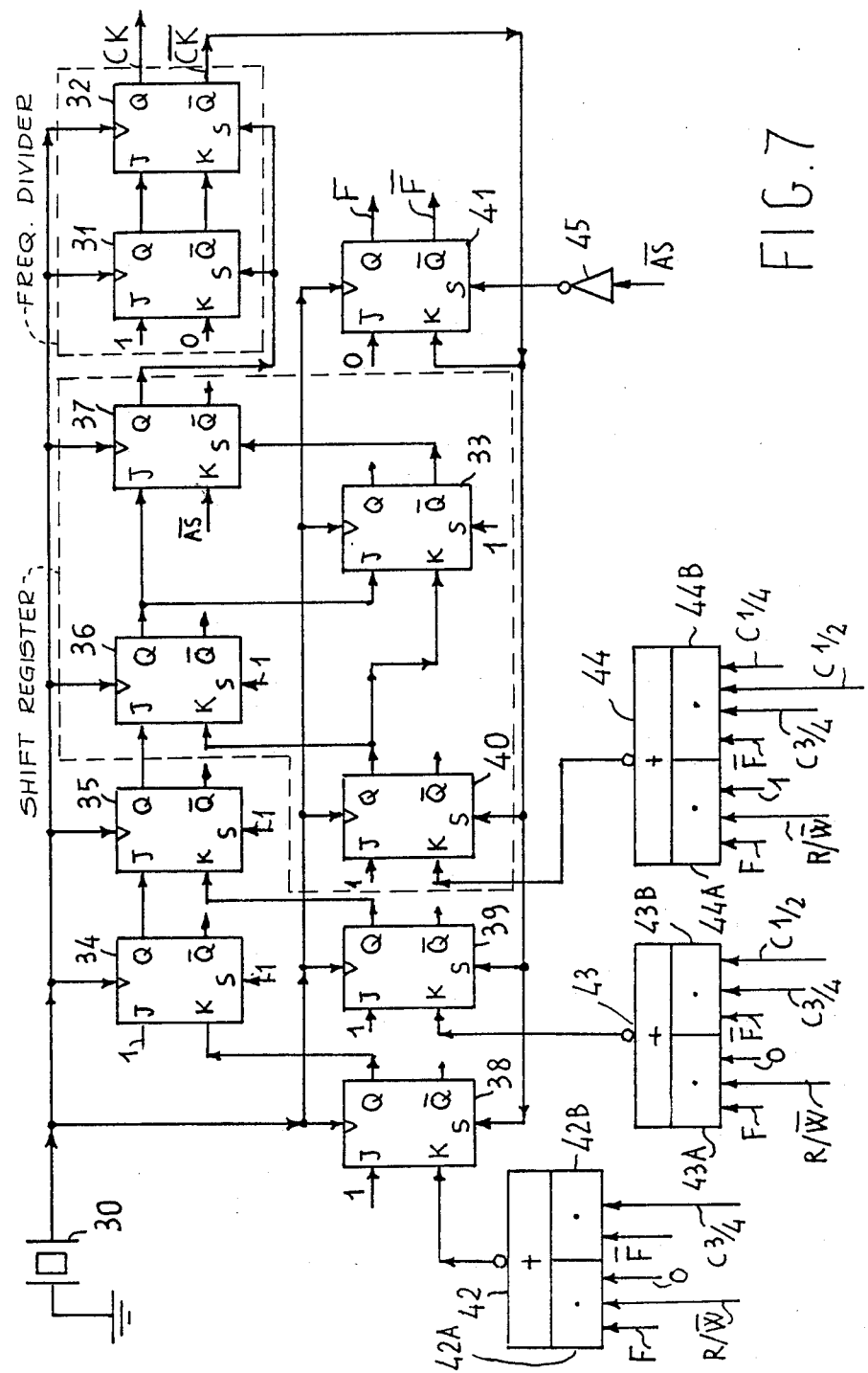
FIG. 7 shows another preferred embodiment of a timing unit for the generation of wait states equal to $\frac{1}{4}$, and multiples thereof of the timing cycle.

FIG. 7 shows an embodiment of a generalized timing unit that reduces this limitation to the minimum and allows the insertion of delays equal to $\frac{1}{4}$, or multiples thereof depending on the commands available at the beginning of the phase to be lengthened.

It should be noted that the $\overline{ECS}$ signal generated by the microprocessor indicates only that the microprocessor intends to start a read/write operation and not that the operation will be actually executed.

The microprocessor is provided with one internal memory or "cache" into which external data are stored.

If the external operation requires data already stored in the cache, the external operation is aborted; that is, is not executed, and the required information is read in the cache.

The signal enabling the external operations is constituted by an $\overline{AS}$ signal; that is normally at logic level 1, and drops to logic level 0 when the external operation must be actually executed. The transition from logic levels 1 and 0 occurs during phase S1 and in the worst case, at the end of phase S1.

The use of this signal, as a condition for the insertion of wait states instead of signal $\overline{ECS}$, allows performances to be enhanced by a further 1 to 2 percent.

The timing unit shown in FIG. 7 meets this goal.

The unit shown in FIG. 7 consists of a crystal oscillator 30, of 11 flip flops 31, 32, 33, 34, 35, 36, 37, 38, 39, 40, 41, of JK type, of 3 AND-OR-INVERTER gates 42, 43, 44 and of an inverter 45.

Flip flops 31 through 41 are preferably of the 74F109 type marketed by FAIRCHILD or equivalent.

They are activated by a positive edge applied to the timing input and their function is defined by the table given below:

| J | K | Q |
|---|---|---|
| 0 | 1 | $Q_n$ |
| 0 | 0 | 0 |
| 1 | 1 | 1 |
| 1 | 0 | $\overline{Q_n}$ |

For J=0 and K=1 the flip flop remains in the same state in which it was before the chock.

For J, K=0 the flip flop is reset.

For J, K=1 the flip flop is set.

For J=1 and K=0 the flip flop toggles.

A logic level 0 present at inputs S or R sets and reset the flip flop in an asynchronous mode overriding the logic shown in the table.

The delay times of the 74F109 flip flop approximate those already given for the 74F113 flip flop.

All the flip flops 31 through 41 have the clock input connected to the output signal of the crystal oscillator and are therefore timed in synchronous mode.

Flip flop 31 has inputs J and K held at logic level 1 and 0 respectively and outputs Q and $\overline{Q}$ connected to inputs J and K of flip flop 32 respectively.

Flip flops 31 and 32 constitute a frequency divider and a CK timing signal is available at the Q output of flip flop 32.

Flip flops 34, 35, 36 are connected in such a way as to make up a shift register that can be loaded in parallel, and flip flop 37 constitutes a further stage of the shift register that acts as a control stage.

Flip flops 38, 39, 40 are connected in such a way as to constitute a register for the temporary and synchronous storage of the delay conditions and for the parallel loading of the shift register.

Flip flop 41 constitutes a phase control circuit.

Specifically flip flop 34 has the J input permanently connected to logic level 1 and the Q output connected to the J input of flip flop 35. Flip flop 35 has the Q output connected to the J input of flip flop 36.

Flip flop 36 has the Q output connected to the J input of flip flops 37 and 33.

The K input of flip flops 34, 35, 36 is connected to the Q output of flip flops 38, 39, 40 respectively.

The K input of flip flop 33 is connected to the Q output of flip flop 40.

The Q output of flip flop 33 is connected to the S set input of flip flop 37 and the Q output of flip flop 37 is connected to the S set input of flip flops 31 and 32.

Flip flops 38, 39, 40 have the J input permanently held at logic level 1 and the K input connected to the output of gates 42, 43, 44 respectively. The S set input of flip flops 38, 39, 40 is connected to the $\overline{Q}$ output of flip flop 32.

The J input of flip flop 41 is held at logic level 0 and the K input is connected to the $\overline{Q}$ output of flip flop 32.

The S set input of flip flop 41 is connected to the output of inverter 45 which receives the microprocessor $\overline{AS}$ signal as an input.

Gates 42, 43, 44 have respectively an input AND section 42A, 43A, 44A that receives signals for the generation of wait states $\frac{3}{4}$, $\frac{1}{2}$, $\frac{1}{4}$ of the timing cycle respectively in phase S2 of the microprocessor operation.

A second input AND section 42B, 43B, 44B receives in input condition signals for the generation of wait states of $\frac{3}{4}$, $\frac{1}{2}$ and $\frac{1}{4}$ of the timing cycle respectively during phase S4 of the microprocessor operation.

Specifically section A of each gate receives the R/$\overline{W}$ signal so as to affect the generation of the wait states in case of read operations, and the F signal present at the Q output of flip flop 41. A third input is permanently connected to logic level 1 if the generation of delays equal to $\frac{3}{4}$ of the timing cycle is required. If it is required that delays equal to $\frac{1}{2}$ of the timing cycle be generated, then the third input of section 44A is held at logic level 1. If it is required that the delays equal to $\frac{1}{4}$ of the timing cycle be generated, then the third input of sections 43A and 44A are held at logic level 1; whereas the third input of the remaining section(s) is held at logic level 0.

All sections 42B, 43B and 44B receive the $\overline{F}$ signal present at the $\overline{Q}$ output of flip flop 41 as well as a C $\frac{3}{4}$ signal, generated by a memory management unit so as to control, when at logic level 1, the generation of a delay equal to $\frac{3}{4}$ in phase S4.

In addition, sections 43B and 44B receive a C $\frac{1}{2}$ signal generated by the memory management unit to control, when at logic level 1, the generation of a delay equal to $\frac{1}{2}$, during phase S4. Finally section 44B receives a C $\frac{1}{4}$ signal generated by the memory management unit to control, when at logic level 1, the generation of a delay equal to $\frac{1}{4}$, during phase S4.

As a preliminary consideration, it can be noted that flip flops 38, 39, 40 are periodically forced to the set state by the $\overline{CK}$ signal at logic level 0 present at the $\overline{Q}$ output of flip flop 32; that is, during phases S0, S2, S4 of the microprocessor operation, which is timed by the CK clock.

During phases S1, S3, S5 if a logic level 1 is present at the K input, flip flops 38, 39 and 40 are held in the set state. If at the K input a logic level 0 is present, they toggle in reset state for the duration of a CK0 clock cycle generated by oscillator 30, and then they switch back to the set state again.

In fact, the duration of phases S1, S3, S5 are equal to two CK0 clock cycles.

Figure 8:
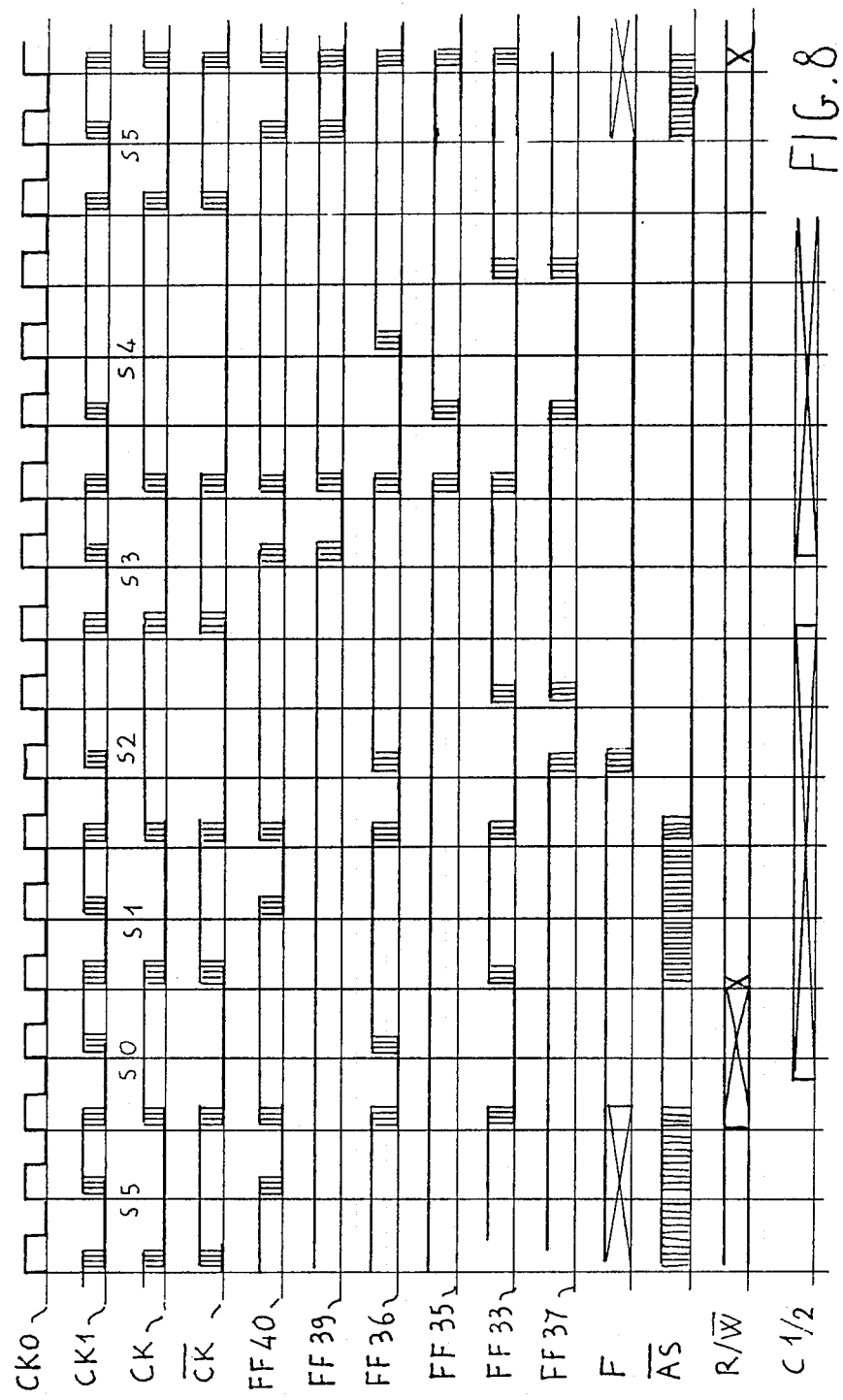
FIG. 8 shows in timing diagram the operation of the unit of FIG. 7.

With these premises, the functioning of the timing unit shown in FIG. 7 can be easily understood by referring to the timing diagram of FIG. 8 that describes the case in which it is necessary to insert $\frac{1}{4}$ delay during phase S2 and a $\frac{1}{2}$ delay during phase S4.

In FIG. 8 CK0 represents the signal output from oscillator 30, CK1 represents the signal present at the Q output of flip flop 31 and CK and $\overline{CK}$ represent the signals present at output Q and $\overline{Q}$ respectively of flip flop 32.

The state of flip flop 38 is not shown because, by assumption, it is always in set state since its J and K inputs are permanently at logic level 1. This applies also to flip flop 34.

FF 40 and FF 39 show the state of flip flops 40 and 39 respectively.

FF 33 shows the state of flip flop 33. FF 37 and FF 41 show the state of flip flop 37 and 41 respectively.

$\overline{AS}$, R/$\overline{W}$ and C $\frac{1}{2}$ show the state of the corresponding signals.

It is clear that without external operations to be carried out and therefore with signal $\overline{AS}$ at logic level 1, flip flop 37 is held in set state and as a consequence flops 1 and 32 act normally as a frequency divider.

Now suppose we are in a timing phase S5; that is, at the end of a read or write operation.

In this phase the state of the $\overline{AS}$ signal is not determined; that is, it can go from logic level 0 to logic level 1 at any time.

Also the state of flip flop 41 is not determined and therefore it can go from reset state to set state at any time. As a consequence, flip flop 40, which is enabled to toggle (because K=1) can go in reset state for the duration of a CK0 cycle and its state is "copied" by flip flop 36 in the next cycle. This implies that flip flop 33 is reset for two CK0 cycles and that, as a result of it, flip flop 31 is enabled to switch according to the state of the J and K inputs during the course of the following phase which, by assumption, is phase S0 of a new read cycle.

In this phase, however, the $\overline{AS}$ signal is definitively at logic level 1; therefore flip flop 37 is held in the set state independently of the logic level present at the J input; that is, at the Q output of flip flop 36.

Likewise flip flop 41 is in a set state at the beginning of phase S0.

During the next phase S1 the R/$\overline{W}$ signal is definitely at logic level 1 to indicate a read operation; therefore flip flop 40 goes in reset state for one CK0 period.

As a consequence, during the next CK0 period; that is, during phase S2, flip flop 36 is reset for one CK0 period and flip flop 33 is reset for two successive CK0 periods.

During phase S2 the $\overline{AS}$ signal is definitely at logic level 0. As a consequence flip flop 41 is reset and flip flop 37 is enabled to copy the state of flip flop 36 and resets for one CK0 period.

This inhibits the switching of flip flops 31 and 32 at the occurrence of the following CK0 clock pulse. Therefore phase S2 is lengthened by $\frac{1}{4}$ of the CK period.

During phase S3 sections 42A and 43A of gates 42 and 43 are disabled; whereas sections 43B and 42B are enabled.

Therefore in the presence of a C ½ signal flip flops 39 and 40 are reset for one CK0 period.

As a consequence, during the next CK0 period; that is, during phase S4, flip flops 35, 36 and 33 are reset. The reset state is held by flip flop 35 for one CK0 clock period, by flip flop 36 for two periods, by flip flop 33 for 3 periods.

Flip flop 37 is then enabled to copy the state of flip flop 36 and goes in reset state for two CK0 clock periods. This disables the switching of both flip flops 31 and 32 during the two following clock pulses.

Phase S4 is therefore lengthened by ½ of the clock period owing to the C ½ signal.

It should be noted that there is a long time margin to preset the C ½ signal which can rise during phase S0, without causing problems to occur and which must rise within phase S2 at the latest. With the CK0 clock immediately following phase S2, the C ½ signal can be removed, however, it can be active throughout phases S4 and S5.

If during phase S5 the C ½ signal is still present, it can cause flip flops 39 and 40 to reset again even if the $\overline{AS}$ signal is still at logic level 0.

However, as already seen, this produces no effect and it does not cause the successive phase S0 to be lengthened because during the phase the $\overline{AS}$ signal is at logic level 1.

FIG. 7 shows only a preferred embodiment.

It is clear that the length of the shift register constituted by flip flops 34, 35 and 36 and the length of the corresponding loading register, which is constituted by flip flops 38, 39, 40 can be either reduced, for inserting delays limited to ½ or ¼ of the CK period, or indefinitively lengthened for generation of delay multiples of ¼.

Also the connections among the various components can be modified in various ways.

For example the J input of flip flop 34 can be connected by logic level 0 and the K input of flip flops 34, 35, 36 must, in this case, be connected to the $\overline{Q}$ output of flip flops 38, 39, 40 respectively. Likewise the J input of flip flop 37 must be connected to the Q output of flip flop 36.

In addition flip flops 38, 39, 40, instead of being controlled through the set input, can be controlled through the reset input, while the external commands can be applied to the J input rather than to the K input which can be permanently held at logic level 0.

It is therefore clear that numerous changes can be made.

It is, however, fundamental for a correct operating mode, independent of the spread of the operating speed of the components, that each timed bistable element of the timing unit be directly connected to other timed bistable elements without any interposition, between outputs and inputs, of additional logic elements that increase the delay time spread.

Only with this approach and the circuit described is it possible to operate to a frequency of up to a maximum of 20 MHz while still using TTL circuits available on the market with the possibility of inserting in the timing frequency, delays or wait states equal to ¼ of the clock period or multiples thereof.

While the invention has been shown and described with reference to preferred embodiments thereof, it will be understood by those skilled in the art that the above and other changes in form and detail may be made therein without departing from the spirit and scope of the invention.

What is claimed is:

1. Timing unit for generating a timing signal for a data processing system using a synchronous microprocessor, said timing unit being capable of generating said timing signal with a normal timing period P and being capable of selectively modifying said period P by introducing wait states equal to ¼ of said period P comprising:
    an oscillator for generating a clock signal having period equal to ¼ P;
    a switching frequency divider, triggered by said clock signal and having a first switching control input for receiving a mask signal having one of two logic levels, the switching of said frequency divider being enabled when said mask signal is at a first logic level, thereby generating said timing signal with period P, the switching of said frequency divider being inhibited by said mask signal at the second logic level, thereby introducing said wait states in said period;
    a shift register, triggered by said clock signal and having a first input for receiving said timing signal and a second input for receiving a first control signal having one of two logic levels, said shift register providing at the output thereof said mask signal at said first level when said control signal is at a first logic level, and providing in output said mask signal at said second level for a duration equal to ¼ P and in preestablished phase relation as to said timing signal, when said first control signal is at a second logic level, said frequency divider and said shift register being composed of JK flip flops cascade connected, each connection between output of one of said flip flops and input of another of said flip flops being direct, without interposition of any logical element.

2. Timing unit as claimed in claim 1 wherein said shift register is comprised of a first and a second cascade connected flip flop, said first flip flop receiving said timing signal at one of the two JK inputs, said second flip flop receiving said first control signal at an asynchronous control input, and wherein said frequency divider is comprised of a third and a fourth cascade connected flip flop, said mask signal being input to at least one of the two J, K inputs of said third flip flop.

3. Timing unit as claimed in claim 1 wherein said shift register is comprised of a first and a second cascade connected flip flop and by a third and fourth flip flop, said third flip flop receiving said timing signal at an asynchronous input and said control signal at one of the two J,K inputs, an output of said third flip flop being connected to one of the two J,K inputs of said first and fourth flip flops, an output of said fourth flip flop being connected to an asynchronous input of said second flip flop, and wherein said frequency divider is comprised of a fifth and sixth cascade connected flip flop, said mask signal being output of said second flip flop and being connected as input to an asynchronous input of said fifth and sixth flip flop.

4. Timing unit as claimed in claim 1 further capable of selectively modifying said period P by introducing wait states in multiples of ¼ P comprising a second shift register triggered by said clock signal and having a first input for receiving said timing signal and a second input for receiving a second control signal having one of two logic levels, said second shift register producing at the output thereof a second mask signal at a first logic level when said second control signal is at a first logic level and producing at the output thereof said second mask signal at a second logic level for the duration of ½ P and in preestablished phase relation as to said timing signal when said second control signal is at a second logic level, said second mask signal being input to a second control input of said frequency divider and inhibiting the switching of said frequency divider when at said second logic level.

* * * * *